United States Patent
Akagawa

[11] Patent Number: 5,886,415
[45] Date of Patent: Mar. 23, 1999

[54] ANISOTROPIC CONDUCTIVE SHEET AND PRINTED CIRCUIT BOARD

[75] Inventor: Masatoshi Akagawa, Nagano, Japan

[73] Assignee: Shinko Electric Industries, Co., Ltd., Nagano, Japan

[21] Appl. No.: 786,615

[22] Filed: Jan. 17, 1997

[30] Foreign Application Priority Data

Jan. 19, 1996 [JP] Japan ................................ 8-007613

[51] Int. Cl.$^6$ .......................... H01L 23/29; H01L 23/48; H01L 23/58; H01L 23/52
[52] U.S. Cl. ...................... 257/789; 257/790; 257/795; 257/778; 257/642; 257/737
[58] Field of Search ................... 257/789, 790, 257/795, 778, 642, 737

[56] References Cited

U.S. PATENT DOCUMENTS

| | | | |
|---|---|---|---|
| 3,832,769 | 9/1974 | Olyphant, Jr. et al. | 29/626 |
| 4,249,302 | 2/1981 | Crepeau | 29/830 |
| 4,811,081 | 3/1989 | Lyden | 357/80 |
| 5,010,038 | 4/1991 | Fox et al. | 437/215 |
| 5,225,966 | 7/1993 | Basavanhally et al. | 361/406 |
| 5,502,889 | 4/1996 | Casson et al. | 29/830 |

FOREIGN PATENT DOCUMENTS

| | | |
|---|---|---|
| 0 564 019 A2 | 3/1993 | European Pat. Off. |
| 0 568 930 A2 | 4/1993 | European Pat. Off. |

OTHER PUBLICATIONS

Patent Abstracts of Japan; vol. 16, No. 170 (E–1194), 23 Apr. 1992 and JP 4017346 A (Sony Corp.), 22 Jan. 1992.
Patent Abstracts of Japan; vol. 18, No. 326 (E_1565), Jun. 1994 & JP 06 077280 A (Sumitomo Electric Ind. Ltd), 18 Mar. 1994.
Patent Abstracts of Japan; vol. 13, No. 123 (E–733), 27 Mar. 1989 & JP 63 291493 A (Sharp Corp), 29 Nov. 1988.
Patent Abstracts of Japan; vol. 095, No. 001, 28 Feb. 1995 & JP 06 283 776 A (Brother Ind Ltd), 7 Oct. 1994.

Primary Examiner—Teresa M. Arroyo
Attorney, Agent, or Firm—Pennie & Edmonds LLP

[57] ABSTRACT

An anisotropic conductive sheet material includes a resin and conductive fillers, such as metallic particles, added in the resin. A conductive layer is formed on one of the surfaces of the anisotropic conductive sheet material. A circuit board includes a substrate having first and second surfaces and a circuit pattern being formed on the first surface of the substrate, an anisotropic conductive sheet having first and second surfaces, a circuit pattern being formed on the first surface thereof. The second surface of the anisotropic conductive sheet is adhered to the first surface of the substrate in such a manner that the circuit patterns are electrically connected to each other by means of the anisotropic conductive sheet. An electrically insulative layer formed on the first surface of the anisotropic conductive sheet to cover the circuit pattern thereof, except that external connecting portions thereof are exposed.

17 Claims, 6 Drawing Sheets

ANISOTROPIC CONDUCTIVE SHEET AND PRINTED CIRCUIT BOARD

BACKGROUND OF THE INVENTION

1. Field of the Invention

The present invention relates to an anisotropic conductive sheet with a conductive layer and a printed circuit board using the same. The present invention also relates to a semiconductor device using such an anisotropic conductive sheet.

2. Description of the Related Art

A multilayer type printed circuit board consisting of a plurality of resin substrates, each carrying circuit patterns on its surface, has been known in the art.

According to such a multilayer type printed circuit board, it is possible to form highly integrated circuit patterns because the degree of freedom increases for wiring circuit patterns.

However, there are problems in that a production process becomes longer to increase a production cost because the electric connections between the respective layers are made through via-holes having a film formed by an electroless plating on the inner wall thereof, and a thickness of the resultant product becomes larger because a plurality of resin substrates are laminated.

SUMMARY OF THE INVENTION

Accordingly, an object of the present invention is to provide a multilayer type circuit board having a smaller thickness, which can be easily produced because the electric-connections between upper and lower circuit patterns are simple, and an anisotropic conductive sheet with a conductive layer suitably used for producing such a circuit board.

According to the present invention, there is provided an anisotropic conductive sheet, having a conductive layer including an anisotropic conductive sheet material comprising a resin and conductive fillers, such as metallic particles, added in the resin; the anisotropic conductive sheet material having first and second surfaces; and a conductive layer formed on one of the first and second surfaces of the anisotropic conductive sheet material.

The conductive layer may be a metallic layer.

According to another aspect of the present invention, there is provided a circuit board comprising: a substrate having first and second surfaces and a circuit pattern being formed on the first surface of the substrate; an anisotropic conductive sheet having first and second surfaces, a circuit pattern being formed on the first surface of the anisotropic conductive sheet; the second surface of the anisotropic conductive sheet being adhered to the first surface of the substrate in such a manner that the circuit patterns on the substrate and the anisotropic conductive sheet are electrically connected to each other by means of the anisotropic conductive sheet; and an electrically insulative layer formed on the first surface of the anisotropic conductive sheet to cover the circuit pattern of the anisotropic conductive sheet, except that external connecting portions thereof are exposed.

The anisotropic conductive sheet can be partially pressed by means of the circuit pattern formed thereon so that the pressed portions of the anisotropic conductive sheet are electrically conductive.

Bumps may be provided on the circuit pattern formed on the substrate and the anisotropic conductive sheet is partially pressed by means of the bumps so that the pressed portions of the anisotropic conductive sheet are electrically conductive.

According to still another aspect of the present invention, there is provided a circuit board comprising: a plurality of anisotropic conductive sheets each having first and second surfaces, a circuit pattern being formed on the first surface of the respective anisotropic conductive sheet; the plurality of anisotropic conductive sheets being laminated on each other in such a manner that the second surface of the anisotropic conductive sheet is adhered to the first surface of the adjacent anisotropic conductive sheet; a substrate having first and second surfaces and a circuit pattern being formed on the first surface of the substrate; the first surface of the substrate being adhered to the second surface of the lowermost anisotropic conductive sheet; the circuit patterns on the plurality of anisotropic conductive sheet and the substrate are electrically connected to each other by means of the plurality of anisotropic conductive sheets; and an electrically insulative layer formed on the first surface of the uppermost anisotropic conductive sheet to cover the circuit pattern thereof, except that external connecting portions thereof are exposed.

The plurality of anisotropic conductive sheets can be partially pressed by means of the circuit patterns formed thereon so that the pressed portions of the anisotropic conductive sheets are electrically conductive.

Bumps may be provided on the circuit pattern formed on the substrate and the anisotropic conductive sheets, except for the uppermost anisotropic conductive sheet, the anisotropic conductive sheets are partially pressed by means of the bumps so that the pressed portions of the anisotropic conductive sheets are electrically conductive.

At least one of the circuit patterns formed on the substrate and on the plurality of anisotropic conductive sheets may be a power supply flat pattern.

At least one of the circuit patterns formed on the substrate and on the plurality of anisotropic conductive sheets may be a ground flat pattern.

According to further aspect of the present invention, there is provided a semiconductor device comprising: a semiconductor chip having upper and lower surfaces, the chip having electrodes formed on the upper surface; an electrically insulating passivation film formed on the upper surface of the semiconductor chip, except for areas where the electrodes exist; a plurality of anisotropic conductive sheets each having upper and lower surfaces, a circuit pattern being formed on the upper surface of the respective anisotropic conductive sheet; the plurality of anisotropic conductive sheets being laminated on each other in such a manner that the lower surface of the anisotropic conductive sheet being adhered to the upper surface of the adjacent anisotropic conductive sheet; the upper surface of the semiconductor chip is adhered to the lower surface of the lowermost anisotropic conductive sheet; the circuit patterns on the plurality of anisotropic conductive sheet and the electrodes of the semiconductor chip are electrically connected to each other by means of the plurality of anisotropic conductive sheets; and an electrically insulative layer formed on the upper surface of the uppermost anisotropic conductive sheet to cover the circuit pattern thereof, except that external connecting portions thereof are exposed.

The lowermost anisotropic conductive sheet can be mechanically pressed partially at positions correspond to the electrodes, so that the pressed portions of the lowermost anisotropic conductive sheet are electrically conductive.

The electrodes of the semiconductor chip can be provided with conductive bumps which protrude upward over the passivation film, so that the lowermost anisotropic conductive sheet is partially pressed by the bumps and, therefore, the pressed portions of the lowermost anisotropic conductive sheet are electrically conductive.

The external connecting terminals may be solder bumps.

DETAILED DESCRIPTION OF THE EMBODIMENTS

The present invention will be described in detail below with reference to the preferred embodiments illustrated in the attached drawings.

Figure 1:
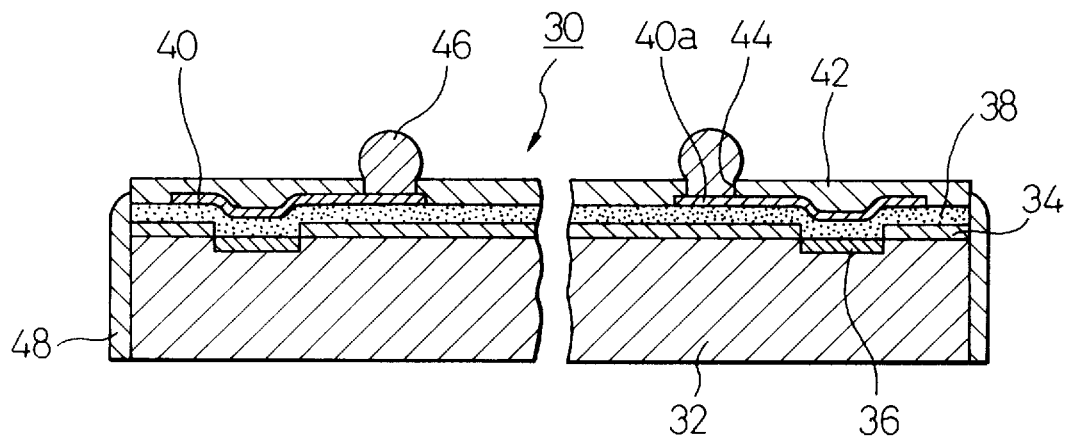
FIG. 1 is a side sectional view of a semiconductor device according to a first embodiment of the present invention.

FIG. 1 is a side sectional view of a semiconductor device 30 using an anisotropic conductive sheet with a conductive layer described later, according to the present invention.

Reference numerals 32 denotes a semiconductor chip; 34, a passivation film made of $SiO_2$ or others; and 36, an Al pad (pad section) built in the semiconductor chip 32. The passivation film 34 is not formed in an area where the Al pad 36 exists, so that the Al pad 36 is exposed. A number of Al pads 36 are formed in a desired pattern on the semiconductor chip 32.

Reference numeral 38 denotes an anisotropic conductive sheet formed while covering the passivation film 34. The anisotropic conductive sheet 38 is formed of a resin containing a conductive filler 39 (FIG. 2) such as a metallic powder, and, by the application of pressure, becomes conductive in the pressed direction due to the continuity of the conductive filler 39.

Figure 2:
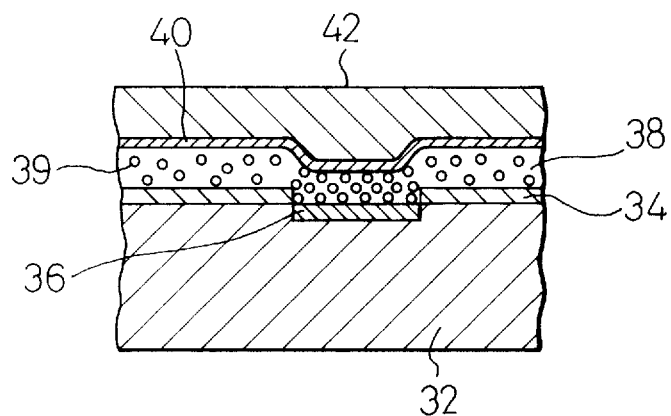
FIG. 2 is a partial enlarged view FIG. 1.

Reference numeral 40 denotes a circuit pattern formed on the anisotropic conductive sheet 38 in a predetermined pattern. The circuit pattern 40 is formed so that it presses the anisotropic conductive sheet 38 as shown in FIG. 2, whereby that portion of the anisotropic conductive sheet 38 is conductive to electrically connect the Al pad 36 with the circuit pattern 40.

The circuit pattern 40 is formed by adhering a metallic foil such as a copper foil to the anisotropic conductive sheet 38 and then etching the same to leave a desired pattern. However, a metallic layer such as a copper layer or an aluminum layer may be formed by a sputtering method, which is then etched to obtain a desired pattern.

Reference numeral 42 is a photosensitive resist film (insulation film) covering the anisotropic conductive sheet 38 and the circuit pattern 40.

The photosensitive resist film 42 is a protective film for the circuit pattern 40 and may be formed of various types of photosensitive solder resist.

Through-holes 44 are formed at suitable locations in the photosensitive resist film 42 corresponding to the respective circuit patterns 40, for example, in a matrix arrangement (so that a contact 40a in the circuit patterns 40 to which an external terminal is to be connected is exposed from the respective via-hole 44).

Reference numeral 46 denotes a bump forming an external terminal which is arranged to be electrically connected with the respective contact 40a via the respective via-hole 44 and projects above the photosensitive resist film 42.

The bump 46 may be formed as a ball bump such as a solder ball as shown in the drawing, but may be formed as a flat land or others. Or a lead pin may be connected as an external terminal. The bump may be formed by a plating such as a nickel/gold plating.

Reference numeral 48 denotes a protective film formed while covering a side wall of the semiconductor chip 32, the passivation film 34 and the anisotropic conductive sheet 38 to prevent the moisture from invading through the boundaries between the respective layers. The protective film 48 may be formed by using a suitable resinous resist, but is not indispensable. Also, instead of the protective film 48, a frame made of a metal or the like may be bonded.

Since the semiconductor device 30 is constructed as described above, it is possible to have a size equal to that of the semiconductor chip 32.

Also, since the anisotropic conductive sheet 38 which is an interposer and the photosensitive resist film 42 can be formed thinner, the semiconductor device 30 becomes thinner.

Since a hardness of the anisotropic conductive sheet 38 and of the photosensitive resist film 42 is not so high, they can function as a shock absorbing layer for protecting a surface of the semiconductor chip 32.

In this regard, a back surface of the semiconductor chip 32 is preferably exposed to enhance the heat radiation. To facilitate the heat radiation, a heat sink or a heat spreader may be bonded thereto.

Figure 3:
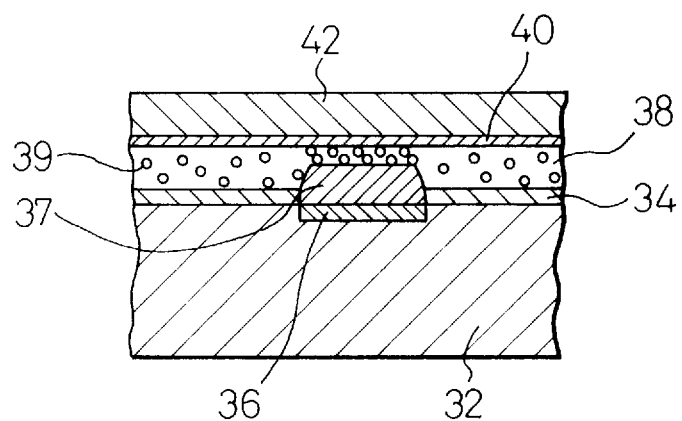
FIG. 3 is a partial side sectional view of a semiconductor device according to another embodiment of the present invention.

FIG. 3 illustrates another embodiment of the present invention.

According to this embodiment, a bump 37 made, for example, of Au is provided on an Al pad 36 of a semiconductor chip 32 to be higher than a passivation film 34, so that a portion of an anisotropic conductive sheet 38 is pressed by the projected bump 37 when the anisotropic conductive sheet 38 is bonded onto the passivation film 34 to cause that portion of the anisotropic conductive sheet 38 to be conductive and thus electrically connect the Al pad 36 to the circuit pattern 40.

As a remaining part of this embodiment is the same as the former embodiment shown in FIG. 1, an illustration thereof will be eliminated.

The same effects as before are obtainable by this embodiment. In addition, this embodiment is advantageous in that the circuit pattern 40 can be generally flat to facilitate lamination.

Figure 4:
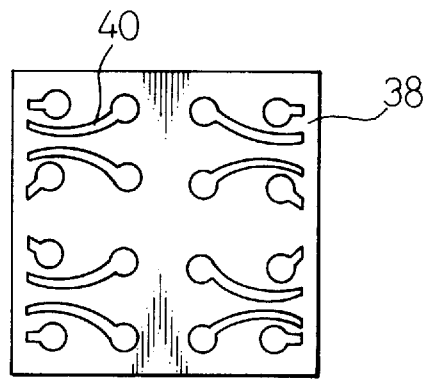
FIG. 4 is an illustration for explaining an anisotropic conductive sheet carrying circuit patterns thereof.
Figure 5:
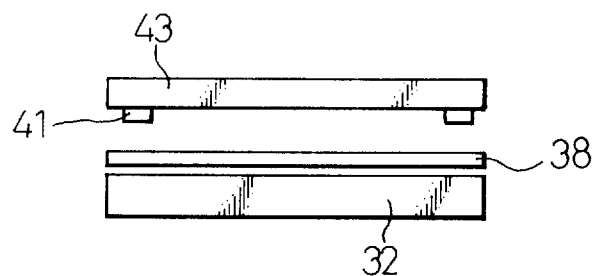
FIG. 5 is an illustration for explaining a press-bonding tool for thermally press-bonding the anisotropic conductive sheet.

FIGS. 4 and 5 illustrate a process for producing the semiconductor device shown in FIG. 1.

As shown in FIG. 4, a metallic foil such as a copper foil is bonded to an anisotropic conductive sheet 38 and then subjected to an etching treatment by a known lithographic process to result in circuit patterns 40. In this regard, a metallic layer may be formed by a sputtering method or others and subjected to an etching treatment to result in circuit patterns 40.

The anisotropic conductive sheet 38 carrying the circuit patterns 40 is overlapped with a semiconductor device 32 so that the circuit patterns 40 coincide with corresponding Al pads 36 arranged on a passivation film 34 of the semiconductor chip 32, as shown in FIG. 5.

Then, the circuit patterns 40 and the anisotropic conductive sheet 38 are pressed together, under the application of heat, by a press-bonding tool 43 with pressing projections 41 arranged in accordance with the arrangement of the Al pads 36, whereby the anisotropic conductive sheet 38 is thermally press-bonded to the passivation film 34.

During the above process, the circuit patterns 40 are pressed by the pressing projections 41 and are deformed as shown in FIG. 2, whereby the anisotropic conductive sheet 38 is pressed at these points to be in conductive contact with the Al pads 36. Thus, the circuit patterns 40 and the Al pads 36 are electrically connected to each other.

Next, to form the electro-insulation film 42, a photo-resist (photosensitive solder resist) is coated on the anisotropic conductive sheet 38 and the circuit pattern 40. After the exposure and development, via-holes 44 are formed. In this regard, the electro-insulation film 42 may be preliminarily provided on the anisotropic conductive sheet 38 and the circuit pattern 40, and then the anisotropic conductive sheet 38 may be bonded onto the semiconductor chip 32.

In this connection, the via holes 44 can be provided in advance at positions corresponding to the respective contacts 40a before the electro-insulation film 42 is coated on the anisotropic conductive sheet 38 and the circuit pattern 40.

The via-holes 44 are filled with solder balls (i.e., solder bumps 46) which in turn are fixed onto the circuit pattern 40 through a reflow process.

A semiconductor device 30 is now completed as stated above.

If necessary, a resist may be coated on side walls of the semiconductor device 30 and dried to form a protective film 48.

Although in the above embodiment, a semiconductor chip 32 formed as a single body is used, a wafer in which a plurality of semiconductor chips 32 are built-in may be used. In this case, after an anisotropic conductive sheet 38, circuit patterns 40, a photo-resist film 42 and bumps 46 have been first formed on the wafer in a similar manner as described above, the wafer is sliced into a plurality of single bodies, whereby a number of semiconductor devices 30 can be formed at once to result in a reduction in production cost. Also, the circuit patterns 40 may be formed after the anisotropic conductive sheet 38 has been bonded to the semiconductor chip 32.

A method for producing the semiconductor device 30 shown in FIG. 3 will be described below. First, gold bumps 37 are preliminarily formed on the Al pads 36 of the semiconductor chip 32. Then the anisotropic conductive sheet 38 on which the circuit pattern 40 shown in FIG. 4 is provided is overlapped with the gold bumps 37, and thermally press-bonded to the latter. In this case, the press-bonding tool 43 with pressing projections 41 shown in FIG. 5 is unnecessary. That is, by pressing the anisotropic conductive sheet 38 as a whole during the thermal press-bonding process, the gold bumps 37 are pressed into the anisotropic conductive sheet 38 to cause the pressed portions of the anisotropic conductive sheet 38 to be conductive. The photo-resist film 42 and the bumps 46 may be provided in the same manner as the above embodiment.

In this regard, the circuit patterns 40 may be provided after the anisotropic conductive sheet 38 has been thermally press-bonded. Also, it is possible to preliminarily form the electro-insulation film 42 on the anisotropic conductive sheet 38 and the circuit pattern 40 and then bond the anisotropic conductive sheet 38 onto the semiconductor chip 32.

Figure 6:
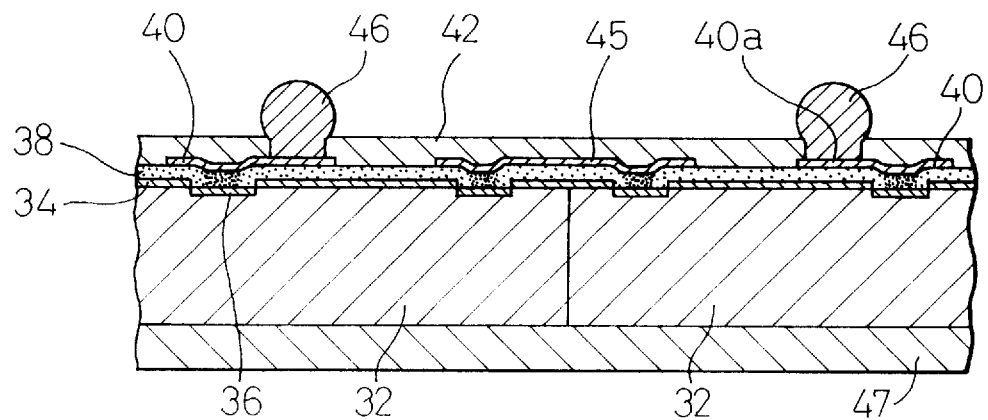
FIG. 6 is a partial side sectional view of a semiconductor device according to a further embodiment of the present invention.

FIG. 6 illustrates a further embodiment of a semiconductor device of the present invention.

According to this embodiment, a plurality of semiconductor chips 32 are arranged on a common substrate 47 such as a heat spreader or the like, and a common anisotropic conductive sheet 38 is formed on the plurality of semiconductor chips 32 in the same manner as the embodiment described above. Then, circuit patterns 40 corresponding to the respective semiconductor chips 32 and circuit patterns 45 for connecting electrodes 36 necessary for electrically connecting adjacent semiconductor chips 32 to each other are formed in the same manner as the embodiment described above. Thereafter, an electro-insulation film 42 is provided and bumps 46 are formed on respective contacts 40a for the connection with external terminals of the respective circuit patterns 40.

That is, the plurality of semiconductor chips 32 are built onto a single semiconductor device 30 to form a multi-chip module.

The plurality of semiconductor chips 32 may be a combination of a micro-processor unit (MPU) and a cache memory, or a series of memories.

According to this embodiment, since the plurality of semiconductor chips are mounted onto the common substrate 47 and the electrodes thereof are electrically connected to each other via a circuit pattern, it is possible to shorten the length of the wires, whereby a semiconductor device excellent in electrical properties is obtainable, such as low signal delay. Also, since the anisotropic conductive sheet and the electro-insulation film can be commonly formed, the production of the semiconductor device becomes easy. In this regard, if the plurality of semiconductor chips 32 were held by a common frame (not shown), the substrate 47 is unnecessary. Alternatively, it is also possible to form the plurality of semiconductor chips on a common wafer.

The semiconductor device according to this embodiment can be produced through the same process as described above.

Figure 7:
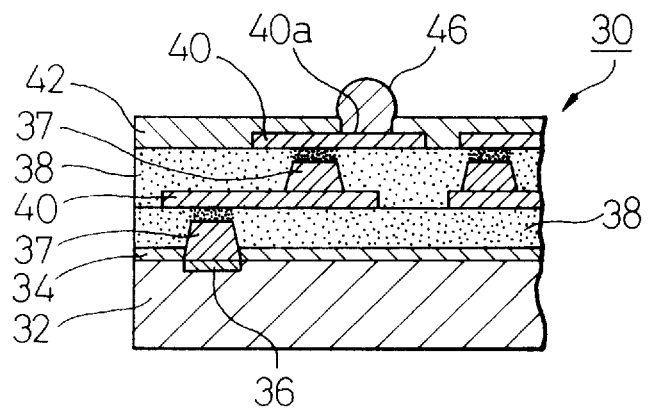
FIG. 7 is a side sectional view of a semiconductor according to an embodiment of the present invention wherein a plurality of anisotropic conductive sheets are layered.

FIG. 7 illustrates a further more embodiment of a semiconductor device 30 according to the present invention.

In this drawing, the same reference numerals are used for denoting the same parts as in the embodiment described above.

According to this embodiment, an anisotropic conductive sheet 38 provided on the upper surface of a semiconductor chip 32 has a multilayer structure (a double layer structure in this embodiment).

An anisotropic conductive sheet 38 formed as a first layer is pressed by bumps 37 of Au, Pb—Sn, or the like formed on Al pads 36 of the semiconductor chip 32 to electrically connect circuit patterns 40 thereof to the Al pads 36 in a similar manner as described with reference to the embodiment shown in FIG. 3. Also, an anisotropic conductive sheet 38 formed as a second layer is pressed by bumps 37 formed at suitable portions of the circuit patterns 40 in the first layer to electrically connect the circuit patterns 40 in the first and second layers with each other. The bumps 37 which should be formed on the Al pads 36 or patterns 40 may be formed by plating, transferring or the like.

Reference numeral 42 denotes a photosensitive resist (electro-insulation film) formed while covering the anisotropic conductive sheet 38 and the circuit patterns 40.

The photosensitive resist film 42 is a protective film for the circuit patterns 40 and may be formed of various photosensitive solder resists.

Via-holes 44 are provided at suitable positions in the photosensitive resist film 42 corresponding to the respective circuit patterns 40 in a matrix arrangement (so that a contact 40a in the circuit pattern 40 to which an external terminal is to be connected is exposed from the respective via-hole 44).

Reference numeral 46 denotes a bump which is an external terminal and projected above the photosensitive resist film 42 so that the contact 40a to be connected to the external terminal is electrically connected to the bump through the via-hole 44.

The bump 46 may be formed as a ball bump such as a solder ball as shown in the drawing, but may be formed as a flat land or others. However, a lead pin may be connected as an external terminal.

In this regard, the connection between the circuit patterns 40 and between the circuit pattern 40 and the Al pad 36 may be made by pressing the circuit pattern 40 as shown in FIG. 1.

Also in this embodiment, it is possible to have a size equal to that of the semiconductor chip 32.

Also, since the anisotropic conductive sheet 38 which is an interposer and the photosensitive resist film 42 can be formed thinner, the semiconductor device 30 becomes thinner.

Since the hardness of the anisotropic conductive sheet 38 and of the photosensitive resist film 42 is not so high, they can function as a shock absorbing layer for protecting a surface of the semiconductor chip 32.

In this regard, a back surface of the semiconductor chip 32 is preferably exposed to enhance the heat radiation. To facilitate the heat radiation, a heat sink or a heat spreader may be bonded thereto.

Figure 8:
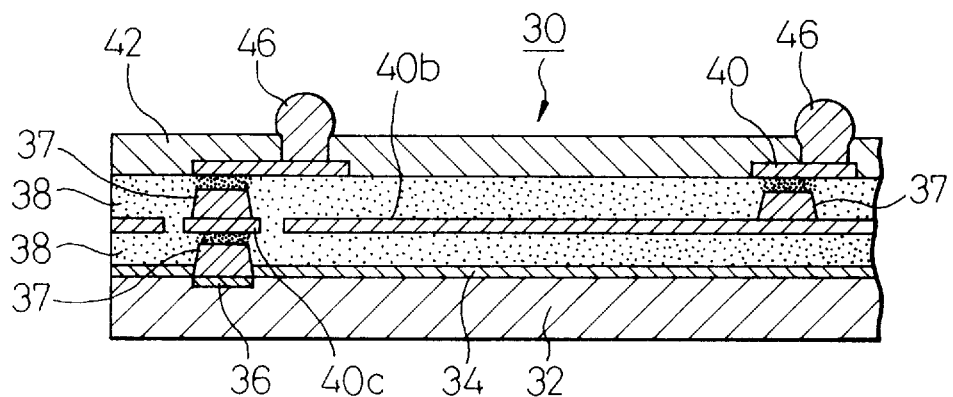
FIG. 8 is a side sectional view of a semiconductor according to an embodiment of the present invention wherein a circuit pattern for the power supply or grounding is provided.

FIG. 8 illustrates a further embodiment wherein the above anisotropic conductive sheets 38 are provided in a multilayer manner.

According to this embodiment, either one of circuit patterns 40 constituting an intermediate layer extends all over the layer as an overall pattern 40b for a power supply or a grounding.

The connection between a circuit pattern 40 on the upper layer and an Al pad 36 on a semiconductor chip 32 is made via a bump 37 formed on a pattern 40c provided, by an annular via-hole, in the overall pattern 40b to be independent therefrom and a bump 37 formed on the Al pad 36, as shown in the drawing. However, the connection therebetween may be made via anisotropic conductive sheets 38, 38 by merely providing a via-hole in the overall pattern 40b and pressing the circuit pattern 40 in the upper layer.

The connection between the grounding Al pad and the overall pattern 40b and that between the overall pattern 40b and a necessary portion of the circuit pattern 40 in the upper layer may be also made by pressing the bump 37 or the circuit patterns 40, 40b in a manner similar to that described above.

If the overall pattern 40b is used for the power supply, the wiring of a power supply line for the upper layer circuit pattern 40 or the arrangement of the Al pads for the power supply becomes free and easy, while, if it is used for the grounding, not only a degree of freedom of the wiring is enhanced but also the electrical properties can be improved because a so-called decoupling capacitor can be formed in the overall pattern by a sputtering process or the like. Or, elements such as resistors may be built therein by the sputtering process or the like.

Figure 9:
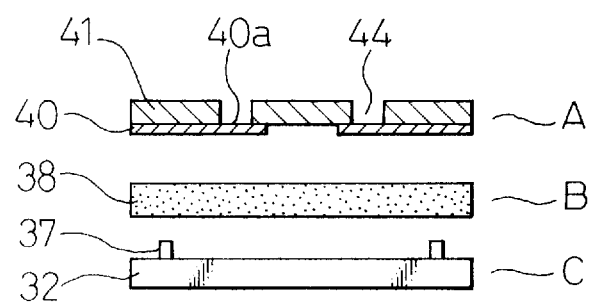
FIG. 9 is an illustration for explaining the assembly of a semiconductor device according to the present invention wherein a circuit pattern is provided in an insulation sheet.
Figure 10:
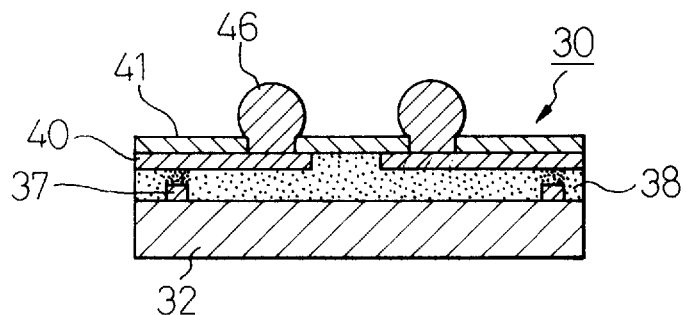
FIG. 10 is a side sectional view of the completed semiconductor device shown in FIG. 9.

FIGS. 9 and 10 illustrate a further embodiment.

Reference numeral 41 denotes an insulation sheet made, for example, of polyimide, epoxy and polyester, and carrying on one surface thereof a circuit pattern 40 made with a copper foil or the like. A via-hole 44 is formed at a position on the insulation sheet 41, at which a contact 40a of the circuit pattern 40 to be connected to an external terminal is provided, so that the contact 40a is exposed (see FIG. 9).

Reference numeral 38 denotes an anisotropic conductive sheet wherein an conductive filler such as a metallic powder is blended in the same manner as described before. Also, reference numeral 37 denotes a bump 37 formed on an Al pad of a semiconductor chip 32.

According to this embodiment, the semiconductor chip 32, the anisotropic conductive sheet 38 and the insulation sheet 41 are overlapped with each other while disposing one surface of the insulation sheet 41 carrying the circuit pattern 40 opposite to the anisotropic conductive sheet 38, and pressed together to be an integral body. Thereby, the anisotropic conductive sheet 38 is pressed by the bump 37 to electrically connect the circuit pattern 40 at that position with the Al pad. A bump 46 is formed as an external terminal in a via-hole 44, and thus a semiconductor device 30 is completed. In this regard, the bump 37 may be formed on the circuit pattern 40.

Also in this embodiment, it is possible to easily form a semiconductor device of a chip size. The connection between the circuit pattern 40 and the Al pad may be easily made via the anisotropic conductive sheet 38. The same process as mentioned above can also be applied to a wafer which is provided with a number of chips. In this case, such a wafer is laminated in the same manner as above and cut into individual semiconductor devices.

As an alternative process in FIG. 9, A and B are first layered and then laminated with C. In this connection, even if C is a wafer which is provided with a number of chips, semiconductor devices according to the present invention can also be obtained by the same process as mentioned above. Namely, such semiconductor devices can be made by laminating the wafer and slicing it into individual devices.

Figure 11:
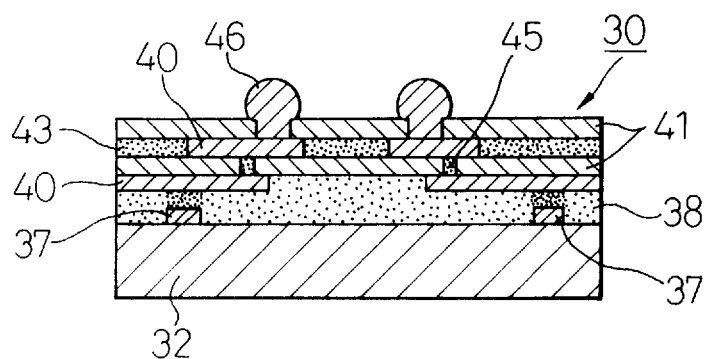
FIG. 11 is a side sectional view of a semiconductor device according to an embodiment of the present invention wherein a plurality of insulation sheets are layered.

FIG. 11 illustrates an embodiment wherein insulation sheets 41 carrying circuit patterns 40 thereon are overlapped with a semiconductor chip 32 in a multilayer manner. The insulation sheets 41 are bonded to each other with an adhesive 43, and the circuit patterns 40 are electrically connected to each other through vias 45, which can be formed by plating or a conductive resin.

The lowermost insulation sheet 41 is fixed via an anisotropic conductive sheet 38 while being electrically connected in the same manner as described before.

Also according to this embodiment, an intermediate circuit pattern may be provided for the power supply or the grounding.

Figure 12:
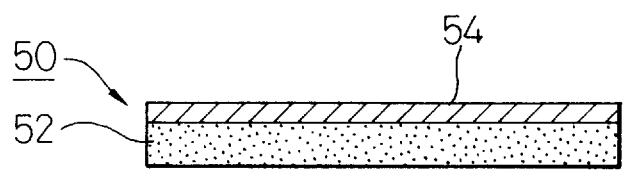
FIG. 12 is a side sectional view of an anisotropic conductive sheet with a conductive layer.

FIG. 12 illustrates an anisotropic conductive sheet 50 with a conductive layer according to the present invention.

The anisotropic conductive sheet 50 is constituted by an anisotropic conductive sheet 52 carrying a conductive layer 54 made of a copper foil or the like on the surface thereof.

The anisotropic conductive sheet 52 is made of a resin such as epoxy, polyimide or silicone blended with an conductive filler such as a metallic filler or the like. Since the silicone resin has a rubber-like elasticity, it can mitigate a stress particularly generated between a semiconductor chip and a substrate mounting the same.

The conductive filler may be a metallic powder such as Ni, a metallic powder such as Ag or Ag—Pd; or Ni, Ag or Ag—Pd covered with a resin such as epoxy, polyimide or silicone; or a resin powder such as epoxy, polyimide or silicone covered with a plated metallic film such as Ni, Ag or Ag—Pd, a necessary amount of which is blended into the resin for creating the conductivity when particles of the conductive filler are brought into contact with each other by pressing the sheet.

The conductive layer 54 may be formed not only by adhering a metallic foil such as a copper foil to the anisotropic conductive sheet 52 but also by forming a metal layer such as copper through a sputtering method or a metallizing method. Or, the conductive layer 54 may be formed in a sheet-like shape by casting, on a metallic foil such as a copper foil, an anisotropic conductive paste prepared by blending an conductive filler with a resin (according to a doctor blade method) and curing the same to result in the anisotropic conductive sheet with a conductive layer.

The anisotropic conductive sheet 50 with a conductive layer is suitably used for forming not only the semiconductor devices 30 shown in FIGS. 1 through 11 but also the following circuit boards.

Figure 13:
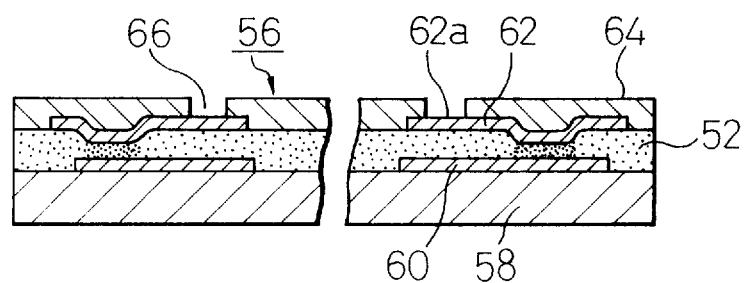
FIG. 13 is a side sectional view of a circuit board according to one embodiment of the present invention.

FIG. 13 shows one example of such circuit boards 56.

Reference numeral 58 denotes a circuit board (substrate) carrying a circuit pattern 60 formed of a copper foil or the like by a conventional method.

Reference numeral 52 denotes an anisotropic conductive sheet carrying, on the surface thereof, a circuit pattern 62 formed by etching the conductive layer 54 of the anisotropic conductive sheet 50 with a conductive layer. This anisotropic conductive sheet 52 is bonded to the substrate 58 on the surface opposite to one carrying the circuit pattern 62. The electrical connection between the circuit patterns 62 and 60 is made via the anisotropic conductive sheet 52 by pressing portions corresponding to the circuit patterns 62 by a suitable tool (not shown) to deform the same.

Reference numeral 64 denotes a photosensitive resist film (electro-insulation film) covering the anisotropic conductive sheet 52 and the circuit patterns 62.

The photosensitive resist film 64 is a protective film for the circuit patterns 62 and may be made of various photosensitive solder resists.

In suitable portions of the photosensitive resist film 64 corresponding to the respective circuit patterns 62, via-holes 66 are formed (so that a contact 62a in the circuit pattern 62 to which an external terminal is to be connected is exposed from the respective via-hole 66).

An external electronic element may be connected to the contact 62a by solder or the like.

Since the anisotropic conductive sheet 52 and the photosensitive resist film 64 can be formed thinner, the circuit board 56 can have a smaller thickness.

If a silicone resin is used, having a rubber-like elasticity, a stress generated between the circuit board and the external electronic element to be mounted thereon can be mitigated.

Since the hardness of the anisotropic conductive sheet 52 and of the photosensitive resist film 64 is not so high, they also function as a shock absorbing layer for protecting the external electronic element to be mounted thereto.

Also, since the anisotropic conductive sheet 52 is used as described above, the electric connection can be easily made between the circuit patterns 60 and 62.

Figure 14:
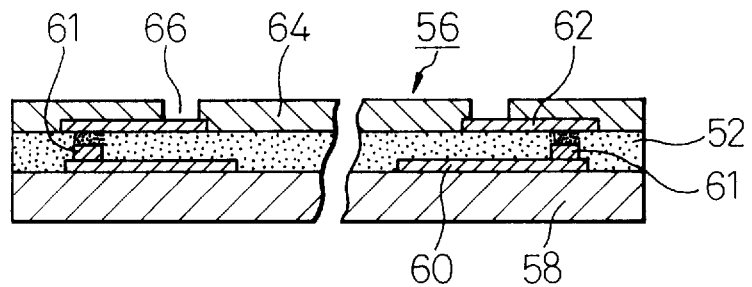
FIG. 14 is a side sectional view of a circuit board according to another embodiment of the present invention.

FIG. 14 illustrates another embodiment of a circuit board 56.

The same reference numerals are used for denoting the same parts as those in the embodiment shown in FIG. 13, the description of which will be eliminated herein.

According to this embodiment, a bump 61 of Au or the like is formed on a circuit pattern 60 in the same manner as shown in FIG. 3 so that an anisotropic conductive sheet 52 is pressed thereby to electrically connect the circuit pattern 60 to a circuit pattern 62. Since the circuit pattern 62 is maintained generally flat by forming the bump 61 in such a manner, the overlapping of the anisotropic conductive sheet 52 is facilitated.

Figure 15:
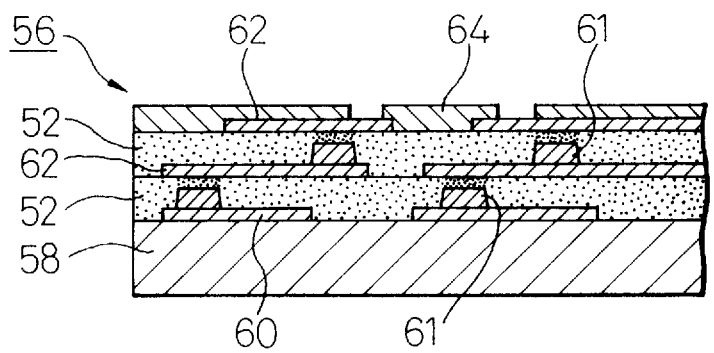
FIG. 15 is a side sectional view of a circuit board according to a further embodiment of the present invention wherein a plurality of anisotropic conductive sheets are layered.

FIG. 15 illustrates an embodiment wherein a plurality of anisotropic conductive sheets 52 are overlapped with a printed circuit board 58.

The connection between circuit patterns 62 carried on upper and lower anisotropic conductive sheets 52, respectively, and the connection between the circuit pattern 62 and a circuit pattern 60 may be made via the anisotropic conductive sheets by pressing and deforming the circuit pattern in the same manner as shown in FIG. 13, or by pressing the anisotropic conductive sheets 52 with bumps 61, 61 formed on the circuit patterns 60 and 62 as shown in the drawing.

In such a manner, it is possible to easily achieve the electrical connection via the anisotropic conductive sheets 52 so that a multilayer printed circuit board 56 is formed.

In this embodiment, the intermediate circuit pattern 62 may be formed as an overall pattern (not shown) for the power supply or the grounding having the same structure as that shown in FIG. 8.

If the overall pattern is used as the power supply, the wiring of a power supply line in the circuit pattern 62 of the upper layer becomes easy; while, if it is used as the grounding, in addition to the freedom of wiring, the electrical properties are improved because a so-called decoupling capacitor can be formed in the overall pattern by a sputtering method or the like.

The overall pattern for the power supply or the grounding may be partially provided in portions corresponding to electronic elements to be mounted.

The printed circuit board may be made of ceramic.

Figure 16:
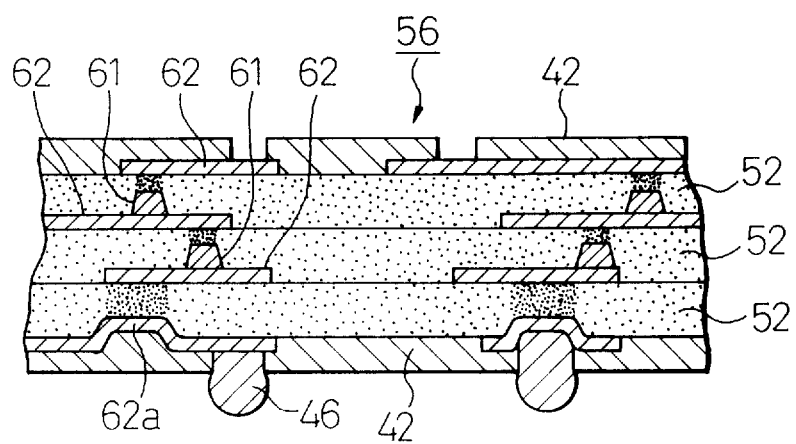
FIG. 16 is a side sectional view showing a structure of an external terminal.

FIG. 16 illustrates another embodiment of a printed circuit board 56.

According to this embodiment, a plurality of (three in the drawing) anisotropic conductive sheets 52 carrying circuit patterns are overlapped.

A first layer is prepared by an anisotropic conductive sheet 50 having, on both surface thereof, conductive layers which are etched to be circuit patterns 62 and 62a, respectively. Each of second and third layers 52 is prepared by an anisotropic conductive sheet having, on one surface thereof, a conductive layer which is etched to be a circuit pattern 62. The three sheets are thermally press-bonded together to form a printed circuit board 56.

The connection between the circuit patterns 62 and 62a in the first layer is made via the anisotropic conductive sheet 52 by pressing and deforming the circuit pattern 62a. The connection between the circuit patterns 62 in the first, second and third layers is made via bumps 61 and the anisotropic conductive sheets 52.

Reference numeral 42 denotes a photosensitive resist film (electro-insulation film) covering the circuit patterns 62 and 62a on the respective surface. External terminals 46 such as solder balls are formed in via-holes provided in one of the surfaces, and circuit patterns 62 are exposed through via-holes provided in the other surface so that contacts to be connected to electronic elements are formed.

In this regard, the respective circuit pattern 62 may be preliminarily provided in the anisotropic conductive sheet 52 or may be formed by an etching or others every time when the anisotropic conductive sheet with a conductive layer (layers) is overlapped.

Figure 17:
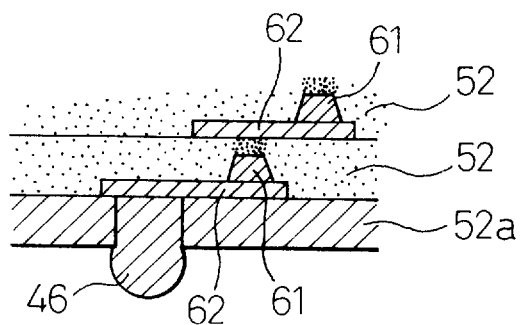
FIG. 17 is a side sectional view of a circuit board according to an alternative embodiment of the present invention.

As shown in FIG. 17, an insulation film 52a of a polyimide sheet, epoxy sheet or an anisotropic conductive sheet carrying a circuit pattern 62 thereon may be used as the first layer, and anisotropic conductive sheets 52 carrying a circuit pattern 62 on one surface thereof as described above may be used as the other layer, which are then overlapped with each other and thermally press-bonded together. In this embodiment, it is also possible to directly provide a via-hole in the first layer to form an external terminal 46. If the insulation film 52a is an anisotropic conductive sheet, a resist may be coated thereon for protecting the surface thereof.

Figure 18:
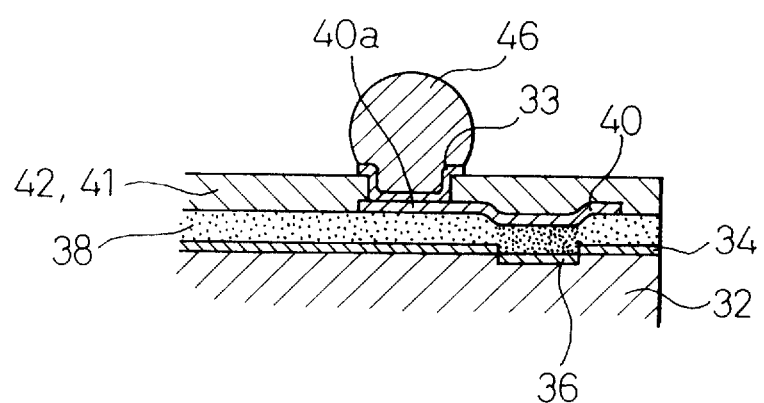
FIG. 18 is a side sectional view of a circuit board according to a further more embodiment of the present invention.

In the respective embodiments described above, the bump 46 used as an external terminal may be provided, as shown in FIG. 18, on a metallic layer 33 which is formed in a bottom 40a of the external terminal and around the peripheral edge and the inner wall of the via-hole provided in the electro-insulation sheet 42 or the insulation sheet 41. Thereby, the bonding area of the bump increases to enhance the bonding strength.

Although the present invention has been described in detail with reference to the preferred embodiments, it is noted that the present invention should not be limited thereto but various changes and modifications can be made without departing from the spirit of the present invention.

According to the present invention, it is possible to easily obtain the electrical connection between circuit patterns in upper and lower layer of a multilayer type circuit board and reduce the production cost to a great extent.

It should be understood by those skilled in the art that the foregoing description relates to only some preferred embodiments of the disclosed invention, and that various changes and modifications may be made to the invention without departing from the spirit and scope thereof.

what is claimed is:

1. A circuit board comprising:
   a substrate having first and second surfaces and a circuit pattern being formed on said first surface of the substrate;
   an anisotropic conductive sheet having first and second surfaces, a circuit pattern being formed on and carried by said first surface of said anisotropic conductive sheet;
   said anisotropic conductive sheet carrying said circuit pattern being bonded to said substrate by adhering said second surface of the anisotropic conductive sheet to said first surface of the substrate so that said circuit pattern carried by said anisotropic conductive sheet on said first surface thereof is electrically connected to said circuit pattern on said first surface of said substrate by means of said anisotropic conductive sheet; and
   an electrically insulative layer formed on said first surface of said anisotropic conductive sheet to cover said circuit pattern of the anisotropic conductive sheet, except that external connecting portions thereof are exposed.

2. A circuit board as set forth in claim 1, wherein said anisotropic conductive sheet is partially pressed by means of said circuit pattern formed thereon so that said pressed portions of the anisotropic conductive sheet are electrically conductive.

3. A circuit board as set forth in claim 1, wherein bumps are provided on said circuit pattern formed on the substrate and said anisotropic conductive sheet is partially pressed by means of said bumps so that said pressed portions of the anisotropic conductive sheet are electrically conductive.

4. The circuit board as set forth in claim 1 wherein the electrically insulative layer comprises an insulation sheet having vias formed therethrough to permit contact with said circuit pattern carried thereon.

5. The circuit board as set forth in claim 4, wherein said insulation sheet, said anisotropic conductive sheet and said semiconductor chip form an integral body.

6. The circuit board as set forth in claim 4, wherein said insulation sheet is bonded to at least one additional insulation sheet which also carries a circuit pattern and having vias formed therethrough, said circuit patterns carried on said insulation sheets being electrically connected through said vias.

7. A circuit board comprising:
   a plurality of anisotropic conductive sheets layered to include a lowermost anisotropic conductive sheet and an uppermost anisotropic conductive sheet, each said anisotropic conductive sheet having first and second surfaces and a circuit pattern formed on and carried by said first surface thereof, said plurality of anisotropic conductive sheets being laminated on each other in such a manner that said second surface of all but said lowermost anisotropic conductive sheets is adhered to said first surface of an adjacent anisotropic conductive sheet;

a substrate having first and second surfaces and a circuit pattern formed on said first surface of said substrate; and an electrically insulative layer formed on the first surface of said uppermost anisotropic conductive sheet to cover said circuit pattern thereof, except that external connecting portions thereof are exposed;

wherein said first surface of said substrate is adhered to said second surface of said lowermost anisotropic conductive sheet; and said circuit patterns on said plurality of anisotropic conductive sheets and said substrate are electrically connected to each other by means of said plurality of anisotropic conductive sheets.

8. A circuit board as set forth in claim 7, wherein said plurality of anisotropic conductive sheets are partially pressed by means of said circuit patterns formed thereon so that said pressed portions of the anisotropic conductive sheets are electrically conductive.

9. A circuit board as set forth in claim 7, wherein bumps are provided on said circuit pattern formed on the substrate and said anisotropic conductive sheets, except for the uppermost anisotropic conductive sheet, said anisotropic conductive sheets are partially pressed by means of said bumps so that said pressed portions of the anisotropic conductive sheets are electrically conductive.

10. A circuit board as set forth in claim 7, wherein at least one of said circuit patterns formed on the substrate and on the plurality of anisotropic conductive sheets is a power supply flat pattern.

11. A circuit board as set forth in claim 7, wherein at least one of said circuit patterns formed on the substrate and on the plurality of anisotropic conductive sheets is a ground flat pattern.

12. A semiconductor device comprising:

a semiconductor chip having upper and lower surfaces, said chip having electrodes formed on said upper surface;

an electrically insulating film formed on said upper surface of said semiconductor chip, except for areas where said electrodes exist; and a plurality of anisotropic conductive sheets each having upper and lower surfaces and a circuit pattern formed on said upper surface thereof;

wherein said plurality of anisotropic conductive sheets are laminated on each other in such a manner to include a lowermost anisotropic conductive sheet and an uppermost anisotropic conductive sheet, the lower surface of said uppermost anisotropic conductive sheet being adhered to the upper surface of an adjacent anisotropic conductive sheet and the upper surface of said lowermost anisotropic conductive sheet being adhered to the lower surface of an adjacent anisotropic conductive sheet; said upper surface of said semiconductor chip is adhered to the lower surface of said lowermost anisotropic conductive sheet; said circuit patterns on said plurality of anisotropic conductive sheets and said electrodes of said semiconductor chip are electrically connected to each other by means of said plurality of anisotropic conductive sheets; and said semiconductor device further comprises an electrically insulative layer formed on the upper surface of said uppermost anisotropic conductive sheet to cover said circuit pattern thereof, except that external connecting portions thereof are exposed.

13. A semiconductor device as set forth in claim 12, wherein said lowermost anisotropic conductive sheet is mechanically pressed partially at positions correspond to said electrodes, so that said pressed portions of the lowermost anisotropic conductive sheet are electrically conductive.

14. A semiconductor device as set forth in claim 12, wherein said electrodes of the semiconductor chip are provided with conductive bumps which protrude upward over said insulating film, so that said lowermost anisotropic conductive sheet is partially pressed by said bumps and, therefore, said pressed portions of the lowermost anisotropic conductive sheet are electrically conductive.

15. A semiconductor device as set forth in claim 12, wherein said external connecting terminals are solder bumps.

16. A semiconductor device as set forth in claim 12, wherein said plurality of anisotropic conductive sheets includes at least one intermediate anisotropic conductive sheet positioned between said uppermost and lowermost anisotropic conductive sheets, upper and lower surfaces of adjacent anisotropic conductive sheets being adhered together.

17. A semiconductor device as set forth in claim 12, wherein the lower surface of said uppermost anisotropic conductive sheet is adhered to the upper surface of said lowermost anisotropic conductive sheet.

* * * * *